April 7, 1970 J. R. CAVALIERE 3,505,535

DIGITAL CIRCUIT WITH ANTISATURATION COLLECTOR LOAD NETWORK

Filed Jan. 3, 1967

*INVENTOR*
JOSEPH R. CAVALIERE

BY Martin G. Reiffin
*ATTORNEY*

United States Patent Office 3,505,535
Patented Apr. 7, 1970

3,505,535
DIGITAL CIRCUIT WITH ANTISATURATION COLLECTOR LOAD NETWORK

Joseph R. Cavaliere, Fishkill, N.Y., assignor to International Business Machines Corporation, Armonk, N.Y., a corporation of New York Filed Jan. 3, 1967, Ser. No. 606,939
Int. Cl. H03k *19/12*
U.S. Cl. 307—203 10 Claims

ABSTRACT OF THE DISCLOSURE

A current switch is provided with a collector load network having a nonlinear impedance for reducing any tendency of the transistors to go into saturation. The load network comprises another transistor extending between the potential source and the collectors of the current switch transistors, together with a resistive bias network to turn the other transistor on when said collectors approach the desired limit of their potential swing toward the saturation region. In one embodiment the respective collectors of a plurality of current switches are dotted so as to eliminate an entire logic stage, while saturation due to simultaneous activation of the transistors is prevented by the nonlinear load impedance network provided for the dotted collectors.

BACKGROUND OF THE INVENTION

Field of the invention

This invention pertains to semiconductor digital circuits, such as current switches, utilized to perform logic functions in digital computers and in other devices wherein pulse or digital signals are employed, and more particularly, to transistor circuits having a novel nonlinear collector load impedance network for reducing the tendency of the transistors to go into saturation.

Description of the prior art

The overall performance capability of digital computers and other systems employing switching circuits is largely dependent upon the switching speed of the individual circuits because of the enormous number of switching operations which must be performed in any given time period or for any particular computation or data process. Therefore, the art has devoted itself to the development of circuits having the highest possible switching speed within the limitations of cost.

The speed of a switching circuit is greatly reduced if the switching transistor is permitted to go deeply into the saturation region during its "on" state. Saturation results in the storage of excess minority carriers in the base of the transistor and the latter cannot be turned "off" until these excess minority carriers are removed from the base by recombination and by diffusion to the collector. The time delay required for the removal of the stored excess minority carriers is called the "storage time" and this constitutes a substantial portion of the time required to switch the transistor from the "on" to "off" states. Therefore, much of the effort of switching circuit design has been devoted to attempts to devise circuit arrangements which would either prevent the switching transistors from entering into the saturation region or at least from going too deeply into saturation.

One approach has been to use a diode clamp to limit the amplitude of the potential swing of the collector so as to prevent the collector-base junction from becoming forward biased, as disclosed in U.S. Patent Re. 25,342 to J. C. Logue and assigned to the assignee of the present application. Although useful in many applications, this patented arrangement has several important disadvantages as compared with the present invention. Referring to FIG. 1 of the Logue patent, it will be seen that an extra power supply 8 is required. Not only does this increase the cost of the circuit, but additional design problems are presented by the voltage tolerances and ripple component inherent in the supply.

Attempts have been made in the prior art to obviate the extra supply by connecting the clamping diode to a voltage divider network which provides the clamping voltage. However, this arrangement is disadvantageous in that if the resistance values of the divider network are sufficiently low the resistors will dissipate an excessive amount of power, whereas if the resistance values are sufficiently high to obviate the dissipation problem the output impedance of the network at the node to which the diode is connected is too high to maintain the desired clamping voltage as current is drawn through the divider network.

Another important disadvantage of the diode clamp arrangement of said prior patent resides in the reverse-bias condition of the diode junction when the diode is "off." Because of the charge difference which exists across the depletion width of the diode junction, the latter is similar to a parallel plate capacitor and is characterized by a so-called barrier capacitance. The latter must be discharged before the diode junction becomes forward-biased to perform the clamping function and this imposes an additional time delay in the operation of the clamp. This factor must be taken into account in the design of the switching circuit with the result that the speed of the circuit is reduced in switching from the "off" state to the "on" state. Furthermore, the clamping diode reduces the speed of the switching circuit going from the "on" state to the "off" state since the problem of stored excess minority carriers is now transferred to the diode which requires a time delay before it can be reversed-biased to permit the collector of the switching transistor to undergo its potential swing toward the "off" state.

Still another attempted solution in the prior art has been to substitute an emitter-follower transistor for the diode 7 shown in said Logue patent. However, the above-noted disadvantages with respect to the cost, ripple component and voltage tolerances inherent in the use of an additional power supply are equally applicable to this expedient.

The prior art circuit which most successfully deals with the problem of transistor saturation is the current switch first disclosed in U.S. Patent No. 2,964,652 to H. S. Yourke and assigned to the assignee of the present application. This circuit has come to be well-known as significantly superior to other switching circuits with respect to both speed and stability. (1, 2) Experimental comparison has shown the current switch to be about ten times as fast as its fastest rivals, the diode-logic and modified resistor-transistor-logic circuits. (3) In the current switch a constant current is supplied and is switched either to one or more input transistors or to a grounded-base transistor, depending upon potential levels of the input signals to the bases of the input transistors in relation to the reference potential at the grounded base. Because the current which flows through the collector load resistors is constant and predetermined, the circuit parameters may be selected so as to limit the potential swing of the collectors and thereby maintain the transistors out of saturation.

(1, 2, 3) See "Publications Referred to in Specification" at end of specification.

However, the current switch has two important limitations if its nonsaturating operation and a resultant fast switching speed are to be achieved. First, tolerances on resistor values, power supply voltages and transistor characteristics must be fairly accurately maintained if the transistor operating points are to approach the saturation region so as to obtain large signal swings. Although these close tolerances are economically achievable when utilizing a so-called hybrid technology wherein the screen-printed thick film resistors may have extremely precise values, the maintenance of close tolerances becomes more expensive in monolithic circuit technology wherein the resistors are formed by diffusion of impurities into the semiconductor wafer and it is therefore much more difficult to maintain precise resistance values.

The second important limitation of the prior art current switch has been with respect to the dotting of collectors; that is, the common connection of the respective collectors of a plurality of current switches. For example, if the in-phase collector of one current switch is directly connected to the in-phase collector of another current switch and both are connected to a potential source by a common collector load resistor, it will be seen that when both transistors are on, two units a current will flow through the single collector load resistor so that the potential swing of the collectors will have twice the amplitude as in the case where only a single transistor is "on." In order to avoid saturation it was therefore necessary to prescribe a so-called "orthogonality" wiring rule whereby only one of the dotted transistors was permitted to be "on" at any one instant. This rule destroyed the primary advantage inherent in the dotting of collectors, namely, to provide a logic function while dispensing with an active stage of logic for same and thereby to eliminate the time delay of the omitted stage.

SUMMARY

A primary object of the present invention is to provide an economical current switch circuit particularly suitable for a low-cost monolithic technology and obviating the need for close tolerances but wherein the transistors are nevertheless prevented from going deeply into the saturation region by a novel nonlinear collector load impedance network.

Another important object of the present invention is to provide for the logical dotting of collectors while maintaining the transistors out of saturation by said nonlinear collector load impedance network, thereby eliminating an entire active stage of logic together with the switching time delays therein so as to increase the switching speed of the logic network as a whole.

Another object is to provide an antisaturation collector load network which obviates the above-described disadvantages of prior art antisaturation techniques, such as diode and transistor clamping circuits, including the cost, ripple component and voltage tolerances of an extra power supply, the time delays due to the reverse bias and heavy forward bias of the junction of the diode or transistor clamp, and the high dissipation and impedance characteristics of prior voltage divider networks which provided the clamping voltage.

Still another advantage of the present invention is that the circuit may be subjected to a larger range of operating temperatures without running the risk of transistors entering deeply into the saturation region.

A further advantage of the subject circuit is that it permits larger tolerances on the upward going potential swing of the input signals being transmitted by preceding cascaded circuits without running the risk of excessive saturation.

It should be understood that the subject circuit may be utilized either to prevent the transistor operating points from entering the saturation region even to a slight extent, or merely to limit entry into the saturation region to a predetermined degree which will not result in a storage time delay in excess of prescribed specifications.

Other objects and advantages of the subject invention are either inherent in the structure disclosed or will be apparent to those skilled in the art.

DESCRIPTION OF THE PREFERRED EMBODIMENT

Figures 1, 2:
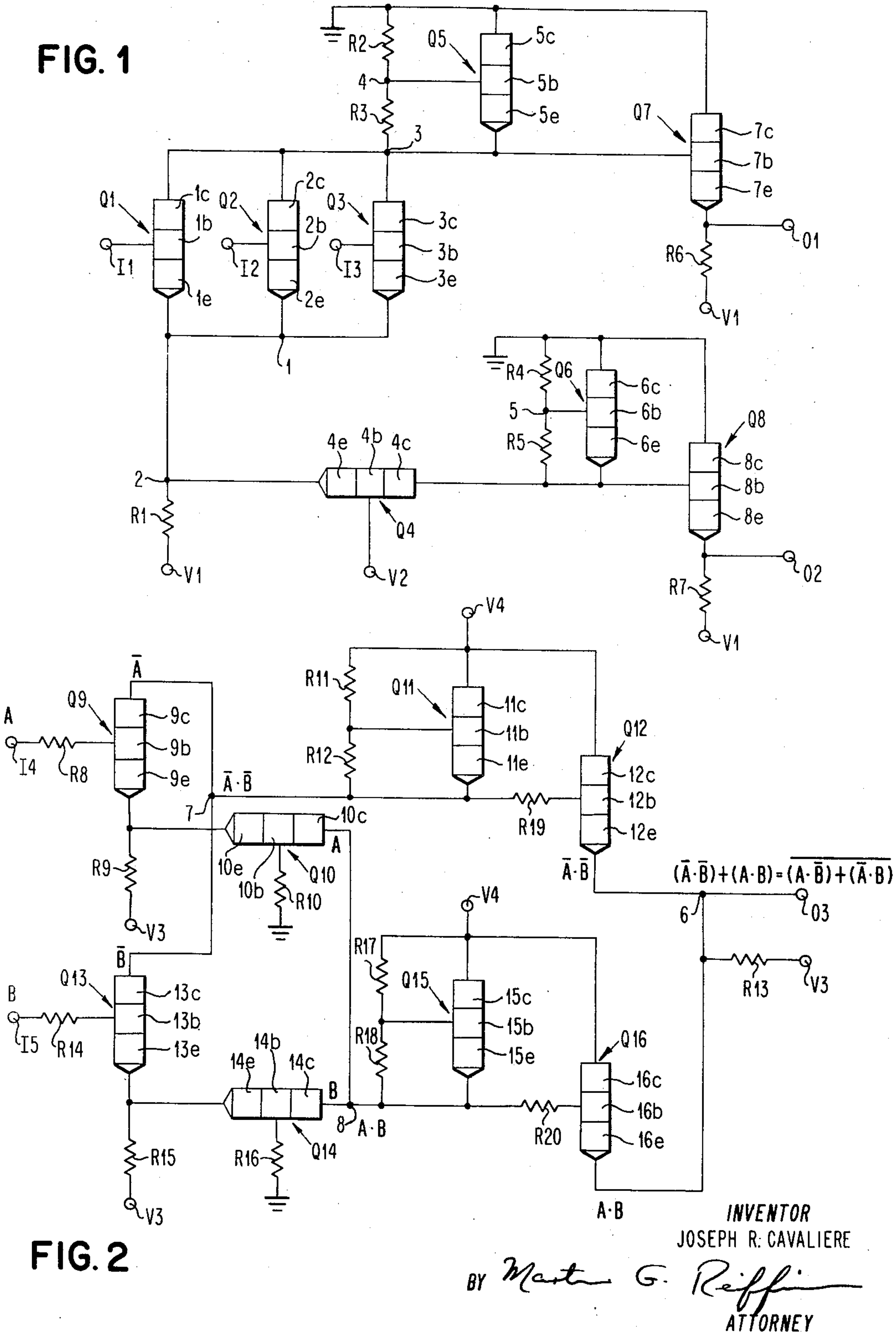
FIG. 1 shows a cost-oriented current switch circuit wherein the nonlinear collector load impedance network of the present invention is utilized to permit wide tolerances without the risk of excessive saturation.
FIG. 2 is a performance-oriented circuit comprising two current switches with dotting of the respective collectors to perform the Inverse Exclusive-OR function while eliminating an entire stage of logic as to improve the switching speed of the overall circuit.

FIG. 1 shows a form of the invention particularly suited for embodiment in a low-cost monolithic circuit technology wherein the tolerances are relatively liberal so as to result in a high yield of usable circuits on each semiconductor wafer. The circuit is of the type known as a "current-switch emitter-follower." The collectors of the current-switch stage are provided with the nonlinear collector load impedance network of the present invention so as to prevent the transistors from going deeply into saturation notwithstanding the liberal tolerances permitted for the resistor values, power supply voltages and transistor characteristics.

More specifically, transistors Q1 to Q3 have their respective emitters 1*e* to 3*e* connected at a common node 1 in turn connected to the upper end 2 of a resistor R1 having its lower end connected to a power supply terminal V1. Also connected to the upper end 2 of resistor R1 is the emitter 4*e* of a transistor Q4 operating in the grounded-base mode and having its base 4*b* connected to a reference potential source V2. Resistor R1 is sufficiently large to provide with power supply terminal V1 a source (a "sink" in terms of conventional current direction) of constant current which is switched to either transistor Q4 or to one or more of transistors Q1 to Q3, depending upon the potential levels at the respective inputs I1 to I3 at the bases 1*b* to 3*b* in relation to the level of the reference potential supplied by source V2 to the base 4*b* of transistor Q4.

The respective collectors 1*c* to 3*c* of transistors Q1 to Q3 are connected at a common node 3 in turn direct-coupled to the base 7*b* of a transistor Q7 operating in the emitter-follower mode. The out-of-phase output is taken at the output terminal O1 connected to emitter 7*e* of transistor Q7. Emitter 7*e* is also connected to an emitter load resistor R6 extending from power supply terminal V1. Collector 4*c* of transistor Q4 is similarly direct-coupled to the base 8*b* of a second emitter-follower transistor Q8 having its emitter 8*e* connected through emitter load resistor $R^7$ to power supply terminal V1. The in-phase output is taken at output terminal O2 connected to emitter 8*e*.

As thus far described, the circuit is the conventional current-switch emitter-follower and requires only collector load resistors in the current switch stage to be operative. If the signal at one or more of the input terminals I1 to I3 is at its upper potential level the corresponding transistor or transistors is activated and the constant current flows therethrough and then through resistor R1 to supply terminal V1. Nodes 1 and 2 are then at their upper potential level so that the voltage across the base-emitter junction of transistor Q4 is insufficient to turn the latter "on." Assuming the existence of a load impedance extending to node 3 at the collectors 1*c* to 3*c* of transistors Q1 to Q3, the resulting voltage drop across this impedance will cause node 3 to be at its lower potential level, whereas the absence of current through the cut-off transistor Q4 will cause the collector 4c of the latter to be at its upper potential level. The signal levels at the collectors of transistors Q1, Q4 are transmitted to the in-phase and out-of-phase output terminals O1, O2 by emitter-follower transistors Q7, Q8, respectively.

It will be seen that if collectors 1c to 3c of transistors Q1 to Q3 and collector 4c of transistor Q4 are provided with load impedances in the form of linear resistors as is conventional in the prior art, then any one or a combination of several parameter deviations may cause one or more of transistors Q1 to Q4 to go deeply into saturation. Such parameter deviations include the magnitudes of resistor R1 or the supposed linear collector load resistors (not shown), the voltage levels of power supplies V1 and V2, the current amplification factor beta of the transistors, and the amplitudes of the input signals. Furthermore, the operating point of one or more transistors may enter deeply into the saturation region as a result of variations in the operating temperatures of the transistor junctions due to changes in the ambient temperature. To obviate this risk of saturation, in the present invention the collectors of the current switch transistors Q1 to Q4 are provided with nonlinear collector load impedance networks which function to prevent the operating points of the transistors from entering deeply into the saturation region notwithstanding wide variations in these parameters.

The nonlinear collector load impedance network comprises a transistor Q5 and resistors R2, R3. Collectors 1c to 3c are connected at node 3 to the lower end of resistor R3 having its upper end connected at node 4 to the lower end of resistor R2. The latter extends to a power supply terminal shown in this embodiment as ground. Transistor Q5 has its collector 5c connected to ground and its emitter 5e connected to node 3. The base 5b of transistor Q5 is connected to node 4 at the connection of resistors R2, R3.

The operation of the nonlinear collector load network of the present invention is as follows. When the potential levels of all of the input terminals I1 to I3 are "down," transistors Q1 to Q3 inclusive are cut off and the constant current flowing to source R1, V1 flows entirely through transistor Q4. The latter is active because the potential of node 1 is below that of reference potential V2 by an amount greater than the threshold cut-in voltage of the base-emitter junction of Q4. A small current flows through resistors R2, R3 to base 7b of transistor Q7. The resulting negligible potential drop across resistor R3 is such as to maintain transistor Q5 cut off. Therefore, the potential of node 3 and collectors 1c to 3c is at its upper level which is substantially at ground potential.

However, if the signal level at one or more of inputs I1 to I3 goes "up" so as to activate the respective transistors of the group Q1 to Q3, the constant current flowing to source V1, R1 flows through those activated transistors. The potential at node 2 is correspondingly raised so that the voltage across the base-emitter junction of transistor Q4 is below the cut-in voltage of the latter and transistor Q4 is thereby cut off.

As the current starts to flow through the transistor group Q1 to Q3, it flows initially through resistors R2, R3 to cause a voltage drop thereacross and therefore the potential at node 3 falls. Nevertheless, the potential at node 3 is prevented from falling substantially below the upper potential level of bases 1b to 3b so as to forward-bias and saturate one or more of transistors Q1 to Q3, in view of the following mode of operation.

As the potential at node 3 continues to fall, eventually the voltage drop across resistor R3 will forward-bias the base-emitter junction of transistor Q5 sufficiently to cause the latter to enter the active region. When this occurs, transistor Q5 is turned "on" so that its emitter presents an extremely low impedance to the collectors 1c to 3c. That is, a large increment of current may flow through transistor Q5 to collectors 1c to 3c without effecting more than a slight drop in potential of the latter. The emitter 5e of transistor Q5 thus maintains the potentials of collectors 1c to 3c of transistors Q1 to Q3 from dropping below a substantially definite level which is predetermined in the design so as either to maintain transistors Q1 to Q3 either entirely out of the saturation region or, at worst, to allow transistors Q1 to Q3 to enter the saturation region only to such a slight extent as will result in a storage time delay of a prescribed amount as will not unduly slow down the switching speed of the transistors.

In a similar manner the collector 4c of transistor Q4 is provided with a nonlinear collector load network which will prevent it from going into deep saturation. This network comprises resistors R4 and R5 connected in series at a node 5 and extending from collector 4c to the potential source terminal shown in this embodiment as ground. A transistor Q6 has its collector 6c connected to ground and its emitter 6e connected to collector 4c of transistor Q4. The base 6b of transistor Q6 is connected to node 5 at the junction of resistors R4, R5. The network comprising resistors R4, R5 and transistor Q6 operates to prevent transistor Q4 from entering deeply into the saturation region in the same manner as that described above with respect to the collector load network R2, R3, Q5 in connection with transistors Q1 to Q3.

In the circuit of FIG. 1 the primary consideration is that of cost, and the nonlinear collector load network of the present invention permits the use of low-cost monolithic circuitry with large tolerances and high yield of usable circuits per wafer without running the risk of malfunction due to excessive saturation. However, in the second preferred embodiment of FIG. 2 the primary consideration is high-speed performance. This is obtained by the dotting of respective collectors of two different current switches so as to perform a logic function with the omission of an entire active stage of logic, thereby eliminating the switching time delays that would be present if the omitted stage had been included. The circuit of FIG. 2 thus provides the Inverse Exclusive-OR function with only two current switches.

More specifically, and referring to FIG. 2 in detail, the first current switch comprises a pair of transistors Q9, Q10 having their respective emitters 9e, 10e connected to the upper end of resistor R9 having its lower end connected to a potential supply terminal V3. An input terminal I4 is connected through a stabilizing resistor R8 to base 9b of transistor Q9 and base 10b of transistor Q10 is connected through a stabilizing resistor R10 to a potential source shown in this embodiment as ground. Stabilizing resistors R8, R10 and those referred to below serve to maintain a positive input impedance as seen looking into the respective bases and thereby prevent spurious oscillators at high frequencies. The constant current flowing to supply terminal V3 through resistor R9 is switched through either transistor Q9 or Q10 depending upon whether the signal at input terminal I4 is at a higher or lower potential than ground level.

Collector 9c of transistor Q9 is connected through stabilizing resistor R19 to base 12b of an emitter-follower transistor Q12 having its collector 12c connected to a supply terminal V4. Emitter 12e of transistor Q12 is connected through an emitter resistor R13 to supply terminal V3. The out-of-phase output signal is taken at output terminal O3 connected to emitter 12e of transistor Q12. Collector 10c of transistor Q10 is similarly connected through a stabilizing resistor R20 to base 16b of a second emitter-follower transistor Q16 having its collector 16c connected to supply terminal V4. Emitter 16e of transistor Q16 is dotted at node 6 to emitter 12e at output terminal O3.

The second current switch comprises transistors Q13, Q14 having their respective emitters 13e, 14e connected to the upper end of a resistor R15. The latter extends to supply terminal V3 to provide a source of constant current. A second input terminal I5 is connected through a stabilizing resistor R14 to base 13b of transistor Q13, and base 14b of transistor Q14 is connected through a stabilizing resistor R16 to a source of reference potential shown at ground level. The constant current flowing through resistor R15 and supply terminal V3 is switched through either transistor Q13 or transistor Q14 depending upon whether the signal potential at input terminal I5 is at a higher or lower level than ground potential.

The out-of-phase collector 13c of transistor Q13 is dotted at node 7 to collector 9c of transistor Q9 and the in-phase collector 14c of transistor Q14 is dotted at node 8 to collector 10c of transistor Q10.

The dotted collectors 9c, 13c are provided with a common nonlinear load impedance comprising a transistor Q11 and resistors R11, R12. Collector 11c of transistor Q11 is connected to potential supply terminal V4 to which is also connected the upper end of resistor R11. The lower end of the latter is connected to the upper end of resistor R12 at a junction connected to base 11b of transistor Q11. The lower end of resistor R12 and emitter 11e of transistor Q11 are connected to node 7 at the dotted connection of collectors 9c, 13c.

In a similar manner, the dotted collectors 10c, 14c of respective transistors Q10, Q14 are provided with a common nonlinear load impedance comprising a transistor Q15 and resistors R17, R18. The upper end of resistor R17 and collector 15c of transistor Q15 are connected to potential supply terminal V4. The lower end of resistor R17 is connected to base 15b of transistor Q15 and also to the upper end of resistor R18. The lower end of the latter and emitter 15e of transistor Q15 are connected to node 8 at the dotted connection of collectors 10c, 14c.

For purposes of explanation, let it be assumed that the predetermined constant current flowing through current switch Q9, Q10 and resistor R9 is substantially of the same magnitude as that flowing through current switch Q13, Q14 and resistor R15, as will usually be the case in practice. This current magnitude flowing through each current switch will be termed a "unit" of current and may be of the order of several milliamperes.

Let it be further assumed that the signal levels at both input terminals I4, I5 are "up," that is, at a positive level with respect to the reference potentials at bases 10b, 14b which are substantially at ground level in the embodiment disclosed. In this event, both transistors Q9, Q13 will be active so that the respective units of current will flow respectively therethrough, whereas transistors Q10, Q14 will be substantially cut off. It will thus be seen that two units of current must flow through the common collector load.

If this collector load were linear, as is conventional in the prior art, the resulting potential swing of collectors 9c, 13c would be exactly twice the potential swing which would occur if only a single unit of current were to flow through the collector load for the case where only one of the two transistors Q9, Q13 is active. If the circuit parameters were selected so that the potential swing for a single unit of current would bring the operating point of the transistor close to the saturation region, as is the usual design practice, then the flow of two units of current when both transistors Q9, Q13 are active simultaneously would certainly bring the operating points of these transistors deep into the region of saturation.

The problem is not solved by selecting the magnitude of a conventional linear load impedance so that the transistor operating points do not enter the saturation region when two units of current flow simultaneously through the impedance. The resulting potential swing when only one unit of current flows through the collector load impedance would then have only half the magnitude as that with two units of current. The succeeding logic circuits in cascade with the circuit under discussion would then be improperly driven by signals having widely varying amplitudes depending upon the number of dotted transistors which are simultaneously active.

This problem of avoiding saturation while maintaining output signals of uniform amplitude is obviated by the nonlinear collector load impedance network of the present invention. When both transistors Q9, Q13 are simultaneously active, the potential at node 7 will fall until eventually the current flowing through resistor R12 causes a voltage drop across the latter of a magnitude sufficiently large to forward-bias the base-emitter junction of transistor Q11. When the base-emitter voltage of transistor Q11 attains the cut-in-threshold, about 0.6 volt for a silicon transistor, transistor Q11 will enter its active region and start to conduct current. The load impedance seen by collectors 9c, 13c is then substantially reduced from the initially high magnitude of the series combination of resistors R11, R12 to the relatively low magnitude presented by emitter 11e of transistor Q11.

The latter operates effectively in the emitter-follower mode to provide this low impedance. As collectors 9c, 13c draw further increments of current only relatively small increments of voltage drop will occur at node 7 because only slight increments of voltage bias across the base-emitter junction of transistor Q11 will cause the latter to supply large increments of current through its emitter 11e to collectors 9c, 13c. Node 7 is thus prevented from swinging down with an amplitude sufficiently large to permit transistors Q9, Q13 from entering saturation.

In the event that only one of the two transistors Q9, Q13 is active, the amplitude of the potential swing at node 7 is of a magnitude almost as large as that with both transistors Q9, Q13 active simultaneously. This is because with only one of the transistors active the swing is nevertheless limited by the activation of transistor Q11 and whether the latter provides a single unit of current to only one of transistors Q9, Q13 or two units of current to both transistors does not radically change the potential swing at node 7 due to the nonlinear collector load impedance presented by transistor Q11 and its biasing network R11, R12.

The above discussion explaining the manner in which the nonlinear collector load network Q11, R11, R12 prevents transistors Q9, Q13 from entering the saturation region is equally applicable to the nonlinear collector load impedance presented by the network comprising the transistor Q15 and resistors R17, R18 which function in a similar manner to prevent the dotted transistors Q10, Q14 from entering into saturation.

The operation of the circuit of FIG. 2 to provide the Inverse Exclusive-OR function will now be described. Let positive signals at inputs I4, I5 be represented respectively by the letters A and B and corresponding negative signals by the respective complements $\overline{A}$ and $\overline{B}$. Because of the phase inversion in transistors Q9, Q13 their respective collectors 9c, 13c will provide the complements $\overline{A}$ and $\overline{B}$. The dotted collector connection at node 7, as viewed from the standpoint of so-called "positive logic," provides the AND function giving at node 7 the logic function $\overline{A}\cdot\overline{B}$.

The signal at collectors 10c, 14c of transistors Q10, Q14 is in-phase with that at input terminals I4, I5 respectively, and hence the function A will appear at collector 10c and the function B will appear at collector 14c. The dotted collector connection at node 8 provides the AND logic function, as noted above with respect to node 7, and hence the function appearing at node 8 is $A\cdot B$. Transistors Q12 Q16 function as emitter-followers and hence no phase-invention takes place therein. Therefore, the function appearing at emitter 12e is $\overline{A}\cdot\overline{B}$, and that appearing at emitter 16e is $A\cdot B$.

The dotted emitter connection at node 6 provides, in the sense of "positive logic," the OR function and hence there appears at the output terminal O3 the final result $(\overline{A}\cdot\overline{B})+(A\cdot B)$. With the application of De Morgan's Theorem, this can be reduced to the Inverse Exclusive-OR function $(A\cdot\overline{B})+(\overline{A}\cdot B)$.

It is to be understood that the two embodiments described above are merely illustrative of two of the many forms which the invention may take in practice and that numerous modifications thereof will readily occur to those skilled in the art without departing from the scope of the invention as delineated in the appended claims which are to be construed as broadly as permitted by the prior art.

PUBLICATIONS REFERRED TO IN SPECIFICATION (1) Rigby, G. A., "High-Speed Emitter-Current Switching," Proceedings of the I.R.E.E., Australia, January 1964, 15.

(2) Rapp, A. K., Robinson, J. L., "Rapid-Transfer Principles for Transistor Switching Circuits," IRE Trans. on Circuit Theory, vol. CT–8, pp. 454–461, December 1961.

(3) Bapat, Y. N., "High Speed Computer Switching Circuits," J. Inst. Telcom. Engrs. (India), vol. 8, No. 1, 1962, pp. 50–60.

I claim:

1. A current switch logic circuit comprising:

(a) at least one input switching transistor having base, collector, and emitter terminals, (b) a reference transistor having base, collector, and emitter terminals and a power supply connected to said reference transistor base terminal, (c) a constant current supply means connected to said input switching transistor emitter terminal and to said reference transistor emitter terminal for supplying a substantially predetermined current either through said at least one input transistor or through said reference transistor in response to the potential between said base and emitter terminals of said at least one input transistor, (d) a first potential source for transmitting current flowing through said at least one input transistor collector, (e) a first two-terminal semiconductor load impedance network connected between said first potential source and said input transistor collector terminal at the out-of-phase current switch output node, (f) said first two-terminal impedance network comprising first active means and first passive means for reducing any tendency of said at least one input switching transistor from going into its saturation region, (g) said first impedance network presenting, in response to voltage and current across the two terminals, only a passive impedance below a given threshold level and a passive and active impedance above said given threshold level.

2. A current switch logic circuit as in claim 1 further including:

(a) a second potential source for transmitting current flowing through said reference transistor, (b) a second two-terminal semiconductor load impedance network connected between said second potential source and said reference transistor collector terminal at the in-phase current switch output node, and (c) said second two-terminal impedance network comprising second active means and second passive means for reducing any tendency of said reference transistor from going into its saturation region, said second two-terminal impedance presenting, in response to voltage and current across the two terminals, only a passive impedance below a given threshold level and a passive and active impedance above said given threshold level.

3. A current switch logic circuit as in claim 2 wherein:

(a) said second active impedance means comprises a second transistor having emitter, base and collector terminals, (b) said second passive means comprises a first resistor connected across said base emitter terminals of said second transistor and a second resistor connected across said base-collector terminals of said second transistor, and (c) said second transistor being switched to a conductive state above said given threshold level.

4. A current switch logic circuit as in claim 3 wherein:

(a) said first active impedance means comprises a first transistor having emitter, base, and collector terminals, and (b) said first transistor is switched to a conductive state above said given threshold level.

5. A current switch logic circuit as in claim 4 wherein:

(a) said first passive means comprises resistor means connected across said collector and emitter terminals of said first transistor.

6. A current switch logic circuit as in claim 3 wherein:

(a) said resistor means includes a resistor connected across said first transistor base-emitter terminals and another resistor connected across said first transistor base-collector terminals, (b) said first potential source for transmitting current flowing through said at least one input transistor collector is ground potential, and (c) said second potential source for transmitting current flowing through said reference transistor is ground potential.

7. A current switch logic circuit comprising:

(A) at least a pair of current switches, each of said current switches comprising, (a) at least one input switching transistor having a base, collector, and an emitter terminal, (b) a reference transistor having base, collector, and emitter terminals, and power supply means connected to said reference transistor base terminal, (c) a constant current supply means connected to said input switching transistor emitter terminal and to said reference transistor emitter terminal for supplying a substantially predetermined current either through said at least one input transistor or through said reference transistor in response to the potential between said base and emitter terminals of said at least one input transistor, (d) a first potential source for transmitting current flowing through said at least one input transistor collector terminal, (e) a first two-terminal semiconductor load impedance network connected between said first potential source and said input transistor collector terminal at the out-of-phase current switch output node, (f) said first two-terminal impedance network comprising first active means and first passive means for reducing any tendency of said at least one input switching transistor from going into its saturation region, said first impedance network presenting, in response to voltage and current across the two terminals, only a passive impedance below a given threshold level and a passive and active impedance above said threshold level, (g) a first output circuit connected to the out-of-phase current switch output node, (h) a second output circuit connected to the in-phase current switch output node, and (B) said output circuits of one of said current switches being connected to said output circuits of the other of said current switches.

8. A current switch logic circuit as in claim 7 wherein each of said at least a pair of current switches comprises:

(a) a second potential source for transmitting current flowing through said reference transistor collector terminal, (b) a second two-terminal semiconductor load impedance network connected between said second potential source and said reference transistor collector terminal at the in-phase current switch output node, and (c) said second two-terminal impedance network comprising second active means and second passive means for reducing any tendency of said reference transistor from going into its saturation region, said second impedance network presenting, in response to voltage and current across the two terminals, only a passive impedance below a given threshold level and a passive and active impedance above said threshold level.

9. A current switch logic circuit as in claim 7 wherein:

(a) said first active means of said first two-terminal impedance network comprises a first transistor having emitter, base, and collector terminals, (b) said first passive means of said first two-terminal impedance network comprises a resistor connected across said first transistor base-emitter terminals and another resistor connected across said first transistor base-collector terminals, (c) said second active means of said second two-terminal impedance network comprising a second transistor having base, emitter, and collector terminals, (d) said second passive means of said second two-terminal impedance network comprising a resistor connected across said base-emitter terminals of said second transistor and another resistor connected across said base-collector terminals of said second transistor.

10. A current switch logic circuit as in claim 9 wherein:

(a) said first and second potential sources are ground potential.

References Cited

UNITED STATES PATENTS

| | | | |
|---|---|---|---|
| 2,964,652 | 12/1960 | Yourke | 307—216 |
| 3,134,912 | 5/1964 | Evans | 307—279 |
| 3,278,761 | 10/1966 | Goyer | 307—215 |
| 3,395,291 | 7/1968 | Bogert | 307—205 |

OTHER REFERENCES

Variable Load Transistor Current Switch by C. L. Hegedus in IBM Technical Disclosure Bulletin, vol. 7, No. 11, dated April 1965, p. 1099.

DONALD D. FORRER, Primary Examiner

S. D. MILLER, Assistant Examiner

U.S. Cl. X.R.

307—207, 213, 215, 216, 218, 237, 300